United States Patent [19]
Logan, Jr.

[11] Patent Number: 5,379,309
[45] Date of Patent: Jan. 3, 1995

[54] HIGH FREQUENCY SOURCE HAVING HETERODYNED LASER OSCILLATORS INJECTION-LOCKED TO A MODE-LOCKED LASER

[75] Inventor: Ronald T. Logan, Jr., S. Pasadena, Calif.

[73] Assignee: California Institute of Technology, Pasadena, Calif.

[21] Appl. No.: 106,445

[22] Filed: Aug. 16, 1993

[51] Int. Cl.$^6$ .............................................. H01S 3/098
[52] U.S. Cl. ...................................................... 372/18
[58] Field of Search ............................... 372/18, 19, 26

[56] References Cited

U.S. PATENT DOCUMENTS 4,635,246  1/1987  Taylor et al. ........................ 372/18

Primary Examiner—Rodney B. Bovernick
Assistant Examiner—Robert E. Wise
Attorney, Agent, or Firm—Michael L. Keller; Robert M. Wallace

[57] ABSTRACT

Two independent laser oscillators are injection-locked to different optical modes of a mode-locked laser, then combined and detected to produce the heterodyne output signal in the microwave to submillimeter wave frequency band. Since the phase fluctuations of the mode-locked laser modes are highly correlated, the phase fluctuations of the heterodyne output signal are greatly reduced, providing a low phase-noise oscillator signal. Since the modes of the mode-locked laser can span hundreds of GigaHertz, the oscillator can be employed to generate microwave, millimeter wave or submillimeter wave frequencies.

20 Claims, 5 Drawing Sheets

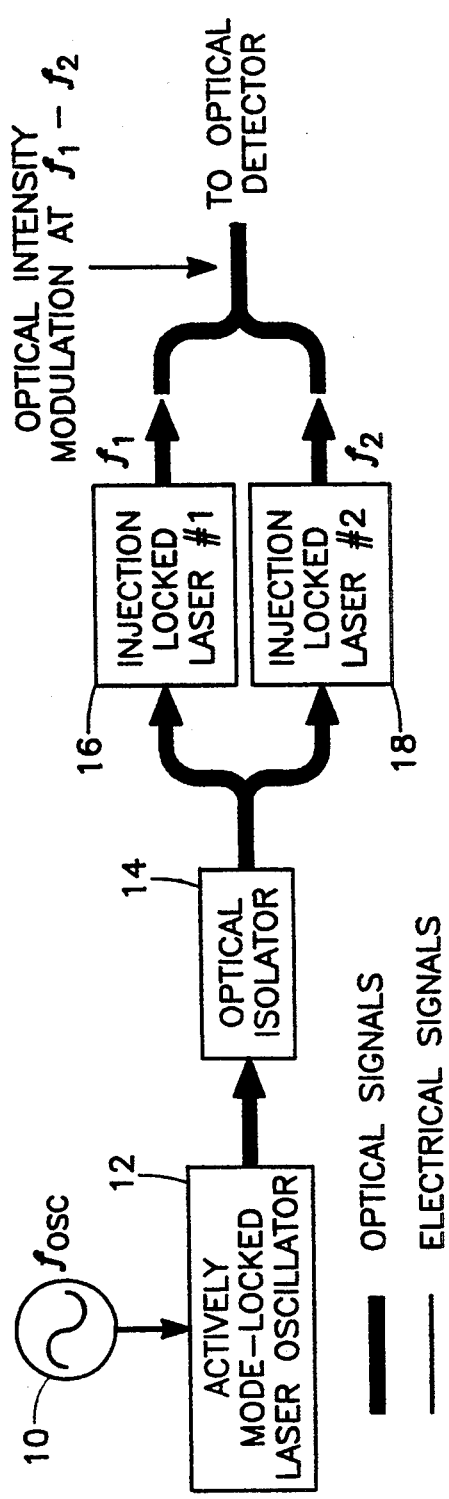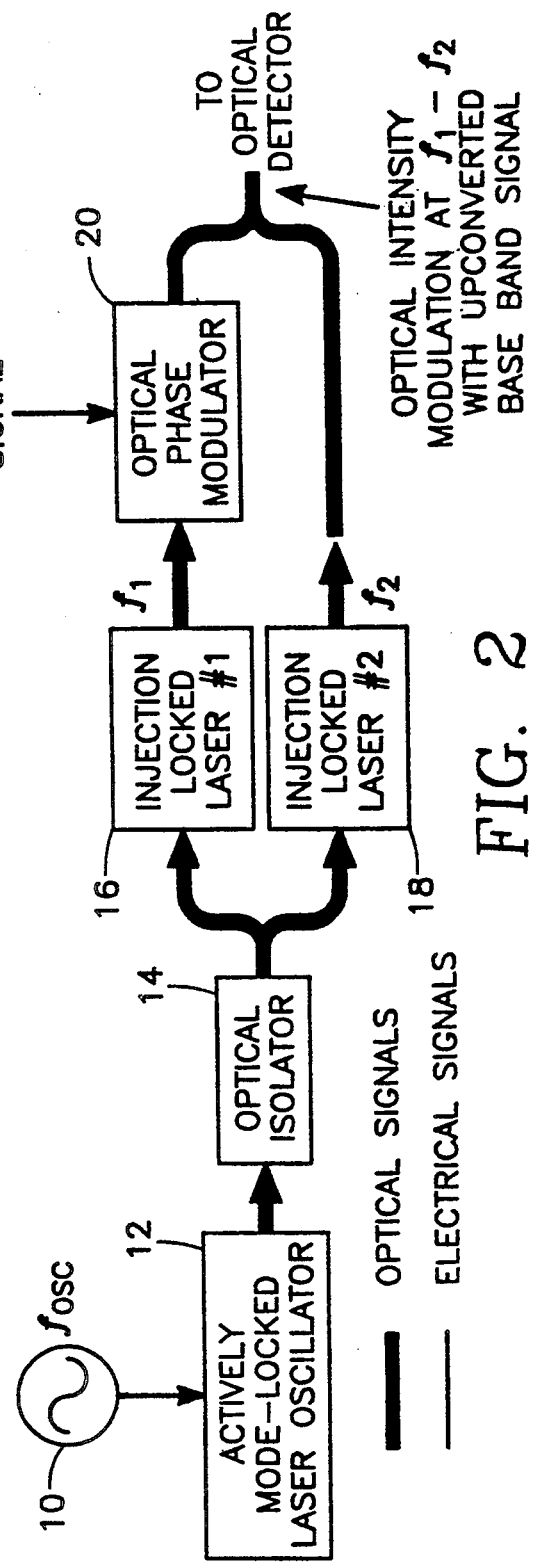

HIGH FREQUENCY SOURCE HAVING HETERODYNED LASER OSCILLATORS INJECTION-LOCKED TO A MODE-LOCKED LASER

BACKGROUND OF THE INVENTION

1. Origin of the Invention

The invention described herein was made in the performance of work under a NASA contract, and is subject to the provisions of Public Law 96-517 (35 USC 202) in which the Contractor has elected to retain title.

2. Technical Field

The invention is related to microwave, millimeter wave and submillimeter wave source and in particular to heterodyne laser oscillators used as such a source.

BACKGROUND ART

Intensity modulation of optical carriers from microwave to TeraHertz frequencies (1 GHz to over 1000 GHz) is desired for radar, communications, and radio-astronomical systems employing fiber-optic wave-guides, (In what follows, the words "millimeter-wave" will be used to refer generally to signals in the range 30 GHz to 1000 GHz.) For most applications, the millimeter wave signal is required to be phase-coherent with a lower-frequency reference signal in the 5 MHz to 10 GHz range. Typically, the phase-stable millimeter-wave signal is generated by electronic non-linear frequency multiplication of the low-frequency reference signal. However, to impress the millimeter-wave signal onto an optical carrier as an intensity modulation is difficult, since the conversion efficiencies of optical intensity modulators at frequencies of 10 to 100 GHz are relatively poor. Optical intensity modulators do not currently exist for frequencies above 100 GHz. Alternatively, millimeter-wave intensity-modulated optical signals can be generated by combining the outputs of two independent lasers with a frequency offset equal to the desired millimeter-wave signal.

Detecting the intensity of the beat frequency with a fast photodiode yields the desired millimeter-wave output. Although this scheme eliminates the need for a millimeter-wave optical intensity modulator, the phase of the beat frequency is not coherent with any reference signal, and typically has very poor phase stability compared to a multiplied low-frequency source such as a quartz crystal oscillator. The linewidth of the millimeter-wave beat frequency generated in this way is of the order of the individual laser linewidths, which are typically many MHz, if semiconductor lasers are used. Schemes to improve the correlation of the laser phase fluctuations base on electronic feedback are possible in principle, but become increasingly difficult and impractical at microwave and millimeter-wave frequencies. It can be conclude, therefore, that the present state of the art does not provide an efficient method of generating phase-stable, millimeter-wave, intensity-modulated optical carriers.

Accordingly, a principal object of the invention is to achieve a highly phase-stable optical intensity modulation from microwave through millimeter-wave frequencies, which is phase-coherent with a low-frequency reference signal.

SUMMARY OF THE DISCLOSURE

The invention is a signal generator including a mode-locked laser having plural optical modes characterized by respective mode frequencies, plural tuned lasers, each of the plural tuned lasers being tuned to a respective optical frequency corresponding to respective ones of the mode frequencies, wherein a difference in the optical frequencies of different ones of the plural tuned lasers corresponds to a desired output frequency, apparatus for injection-locking the plural tuned lasers to corresponding ones of the plural optical modes of the mode-locked laser, and apparatus for combining the optical outputs of the plural tuned lasers whereby to generate at least an output signal having an output frequency equal to the difference in the optical frequencies of different ones of the plural tuned lasers. The plural optical modes of the mode-locked laser span a frequency band at least hundreds of GigaHertz wide, and the output frequency is in a band encompassing millimeter and submillimeter wavelengths. The plural tuned lasers include a pair of C.W. lasers each narrowly tuned to a respective optical frequency corresponding to a frequency difference therebetween equal to the output frequency. Injection-locking is accomplished by coupling optical radiation from an optical cavity of the mode-locked laser to an optical cavity of each one of the plural tuned lasers. An up-converter modulates the optical output of one of the plural tuned lasers with the baseband signal prior its being combined by the apparatus for combining with an electrooptical phase modulator having an optical input connected to the one tuned laser and an optical output connected to the combining apparatus and an electrical control input connected to received the baseband signal.

Each of the plural tuned lasers includes apparatus for narrowly tuning the laser to the respective optical frequency. In one implementation, each of the plural tuned lasers is a semiconductor laser having an optically active semiconductor layer underlying an upper semiconductor layer, and the apparatus for narrowly tuning includes an optical grating overlying the optically active layer, the grating having a grating spacing corresponding to the respective optical frequency.

The mode-locked laser is a semiconductor laser having an optically active layer, and the apparatus for injection-locking includes plural optical fibers connected between an edge of the optically active layer of the mode-locked laser to an edge of the optically active layer of respective ones of the plural tuned lasers.

In one implementation, each one of the plural tuned lasers includes a distributed feedback electrode overlying the optically active layer of the tuned laser, a photodiode sensing the optical output of the tuned laser, microprocessor apparatus coupled to an electrical output of the photodiode for generating a distributed feedback voltage value so as to maximize an optical amplitude sensed by the photodiode, and apparatus for applying a voltage corresponding to the distributed feedback voltage value to the distributed feedback electrode whereby to maintain an effective cavity length of the tuned laser at an optimum value for the optical frequency of the tuned laser.

In another embodiment, the invention is an optical down-converter for down-converting an incoming signal constituting a carrier signal of a particular carrier frequency and a baseband signal, including a local oscillator. The local oscillator is the signal generator described above. The down-converter further includes apparatus for modulating the local oscillator optical signal with the incoming signal so as to produce a mixed signal, and apparatus for detecting the baseband signal. The apparatus for modulating the local oscillator optical signal includes an electrooptical modulator having an optical input connected to receive the local oscillator optical signal, an optical output and an electrical control input connected to receive the incoming signal. The apparatus for detecting the baseband signal includes a photodiode optically coupled to the optical output of the electrooptical modulator. The photodiode of the apparatus for detecting the baseband signal is characterized by a frequency response roll-off suitable for rejecting frequencies corresponding to the local oscillator frequency.

The invention is useful for increasing the information transmission bandwidth in existing optical fiber networks, as well as for generation of microwave (1 GHz) through submillimeter wave signals (>300 GHz) with lower phase noise than has previously been possible. Some of the applications that could utilize this invention include: high-speed fiber-optic networks, satellite and cellular personal communication systems, phased-array radar systems, microwave and millimeter wave test equipment, radio-astronomical observatories, laser ranging systems, spacecraft communications systems, fiber-optic delay line stabilized oscillators. The invention is well-suited to opto-electronic integration and mass production.

BRIEF DESCRIPTION OF THE DRAWINGS

FIG. 1 is a schematic diagram of a heterodyne laser oscillator of one embodiment of the invention employing two injection-locked lasers.

FIG. 2 is a schematic diagram corresponding to FIG. 1 illustrating an up-conversion feature of the invention.

FIG. 10 is a diagram of another embodiment of the invention employing a large number of injection-locked lasers.

DETAILED DESCRIPTION OF THE PREFERRED EMBODIMENTS

Figure 3:
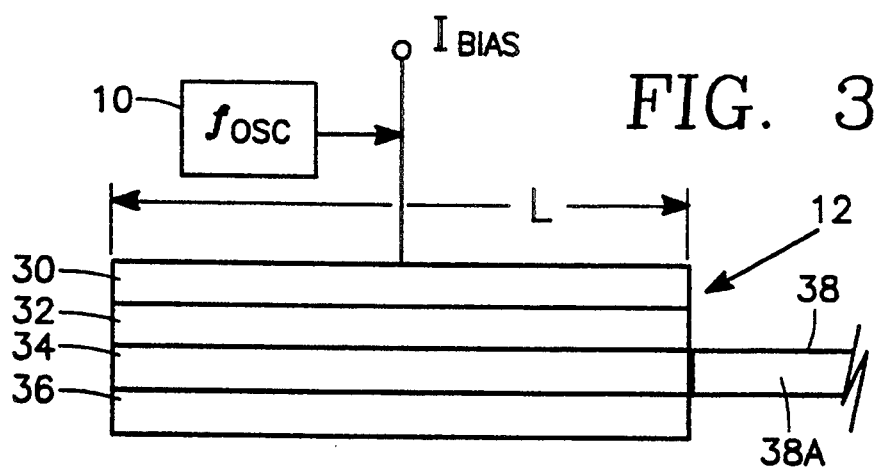
FIG. 3 is a diagram of a mode-locked laser employed in carrying out the invention.

The invention is based on achieving a high-degree of correlation between the phase fluctuations of two independent single-frequency lasers, operating at two slightly different optical frequencies. The frequency difference of the lasers is set equal to the desired millimeter-wave frequency, as described previously. The phase fluctuations of the lasers are forced to be correlated by injection-locking them with separate longitudinal modes of a third multimode laser. The multimode laser is forced to have a high degree of phase coherence between its longitudinal modes by the process of "active mode-locking" via modulation with a low-frequency reference signal. The phases of the two injection-locked single-mode lasers will thus be highly correlated, and the detected millimeter-wave optical intensity modulation will not only have low phase noise, but will also be phase-coherent with the low-frequency reference signal.

A conceptual block diagram of the millimeter-wave optical modulation embodiment of the invention is depicted in FIG. 1. Beginning at the left of the diagram, an electronic reference frequency oscillator 10 drives the actively mode-locked laser 12 at a frequency $f_{osc}$ coincident with the longitudinal mode separation of the mode-locked laser cavity. The frequency $f_{osc}$ must be harmonically related to the desired millimeter-wave output frequency. When the laser 12 is mode-locked, all of the longitudinal modes have a well-defined phase relationship that is time-invariant. The optical spectrum thus resembles a "comb" of frequencies, separated by the driving frequency $f_{osc}$. If N longitudinal modes are locked, the detected intensity of this signal would appear as a stream of pluses at a repetition rate of $1/f_{osc}$, with pulsate widths of approximately $q/(Nfosc)$, where q is a measure of the bandwidth of the laser. The output of the mode-locked laser 12 is passed through an optical isolator 14 to prevent reflected power from destabilizing its output, and then split before being coupled into the continuous-wave (cw) single-frequency lasers #1 and #2 (16, 18, respectively).

The single-frequency lasers #1 and #2 are injection-locked to different longitudinal optical modes of the actively mode-locked laser 12, via frequency-selective tuning elements in their respective cavities. Thus, lasers #1 and #2 each select and amplify only one mode of the multimode output spectrum generated by the actively mode-locked laser 12. Finally, the outputs of the injection-locked lasers #1 and #2 are combined to yield a heterodyne signal. The detected intensity of this signal contains DC term plus a time-varying term at the frequency difference of lasers #1 and #2. This frequency difference can be varied from a minimum of $f_{osc}$ to a maximum of $N*f_{osc}$, where N is the number of locked modes. Due to the extremely wide optical bandwidths of laser gain media, it is not uncommon for mode-locked lasers to have hundreds of locked modes spanning more than 1000 GHz. Therefore it is possible to generate intensity modulation signals over this wide range of frequencies using this technique. More importantly, the generated signals will have low phase noise compared to existing techniques of signal generation at these frequencies. The millimeter-wave intensity-modulated optical signals can be detected by a fast photodiode to convert them to electrical signals.

As shown in FIG. 2, the millimeter-wave signal itself can be modulated by a baseband information signal, by an optical phase modulator 20 linearly modulating the phase of the output signal from laser #1 prior to combining it with laser #2. This is a simple means of up-converting a baseband signal containing information in analog or digital form to an intensity-modulation centered at the millimeter-wave carrier frequency. This aspect of modulation would be useful for millimeter-wave subcarrier multiplexing. Several difference frequencies, each with a unique baseband modulation, could be generated using this scheme, by adding additional injection-locked lasers. A complex subcarrier multiplexed modulation signal can thus be generated in this way.

In the description that follows, the invention is implemented using only semiconductor lasers. However, it should be understood that the invention is not limited to any particular implementation, as other types of lasers may be employed, particularly in implementing the CW lasers. The millimeter or submillimeter wave source of the invention can be implemented in a single hybrid package or on a single integrated circuit, particularly if semiconductor lasers are employed.

Figure 4:
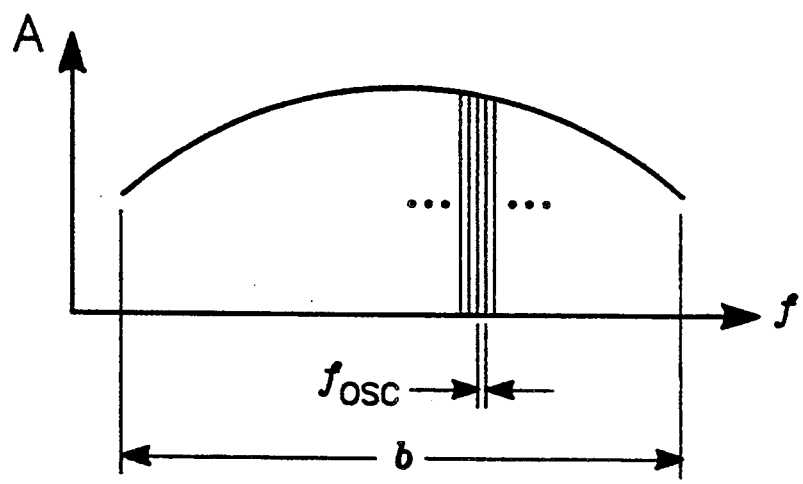
FIG. 4 is a graph illustrating the spectrum of the mode-locked laser of FIG. 3.
Figure 5:
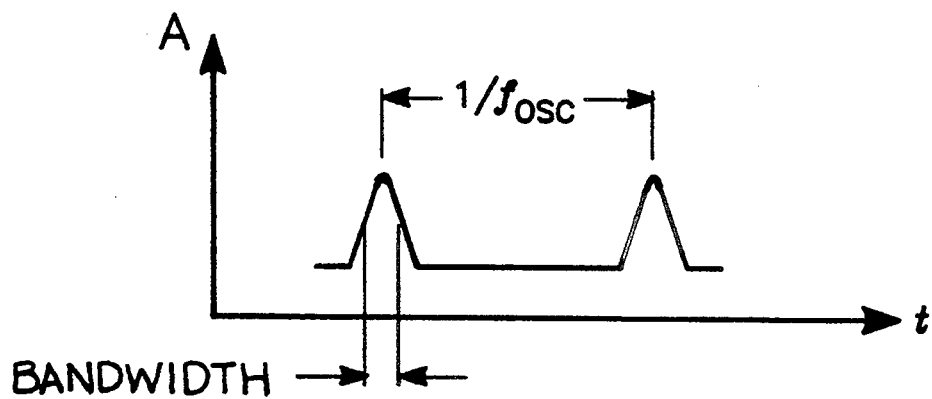
FIG. 5 is a diagram of a tutorial example of a time-domain waveform of the output of the mode-locked laser of FIG. 3.

FIG. 3 illustrates a semiconductor mode-locked laser employed as the mode-locked laser 12 of FIGS. 1 and 2. It includes a top metal electrode 30, an upper cladding layer 32, an optically active layer 34 and an lower cladding layer 36. The optical output of the laser of FIG. 3 is transmitted on an optical fiber 38 connected at one end to the edge of the optically active layer 34. The laser is driven by an oscillator 40 of frequency $f_{osc}$ equal to the separation between modes of the laser. The oscillator frequency $f_{osc}$ is harmonically related to the cavity length L and the speed of light c as follows: $m^*f_{osc} = n^*c/2L$, where n and m are integers. The spectrum of the mode-locked laser of FIG. 3 is illustrated in FIG. 4, showing that there are many frequency modes within a band (b) of frequencies separated by the mode separation frequency $f_{osc}$. FIG. 5 illustrates the time domain output of the mode-locked laser of FIG. 3, showing that the output is a pulse train of repetition rate $f_{osc}$ and pulse width 0.44/b if the spectrum is Gaussian and all modes within the band b are mode-locked. The invention exploits the fact that the phase noise is the same for all the modes of the mode-locked laser, that is, there is essentially zero phase variation between modes.

Figure 6:
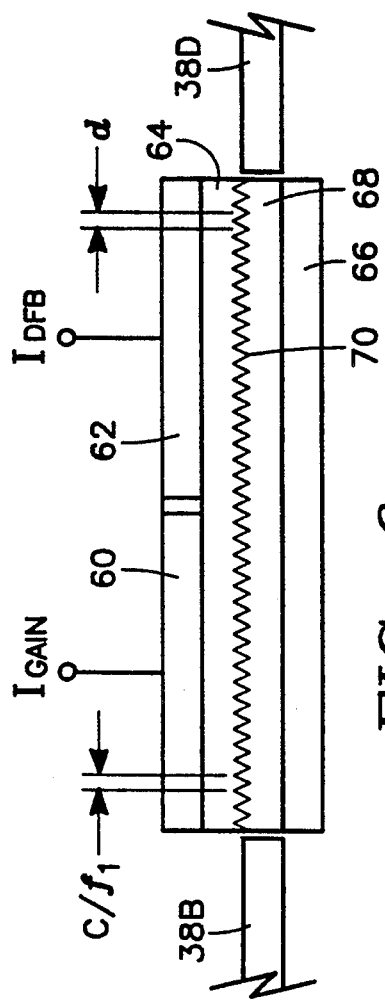
FIG. 6 is a diagram of a tuned C.W. laser employed as one of the injection-locked lasers in the invention.

FIG. 6 illustrates a semiconductor laser employed as one of the CW lasers 16, 18 of FIGS. 1 and 2. It includes a top metallization layer including two excitation electrodes 60, 62. Further, top and bottom cladding layers 64, 66 sandwich an optically active layer 68 therebetween. The CW frequency of the laser is determined by the spacing d between gratings in a grating pattern 70 in the interface between the optically active layer 68 and the top cladding layer 64. Generally, if the laser CW frequency is $f_1$, then the grating spacing d is $c/f_1$, where c is the speed of light in the optically active layer 68. The electrode 60 is connected to a D.C. current $I_{gain}$ which supplies the basic gain power source of the laser. The other electrode 62 is connected to a distributed feedback current $I_{DFB}$ affecting the effective optical length (proportional to the CW frequency) of the laser cavity. The laser is very narrowly tuned to a CW frequency which may be tuned by changing the current $I_{DFB}$ on the electrode 62. It is injection-locked to the mode-locked laser of FIG. 5 by connection of the optical fiber 38 from the mode-locked laser of FIG. 3 to the end of the optically active layer 68.

Figure 8:
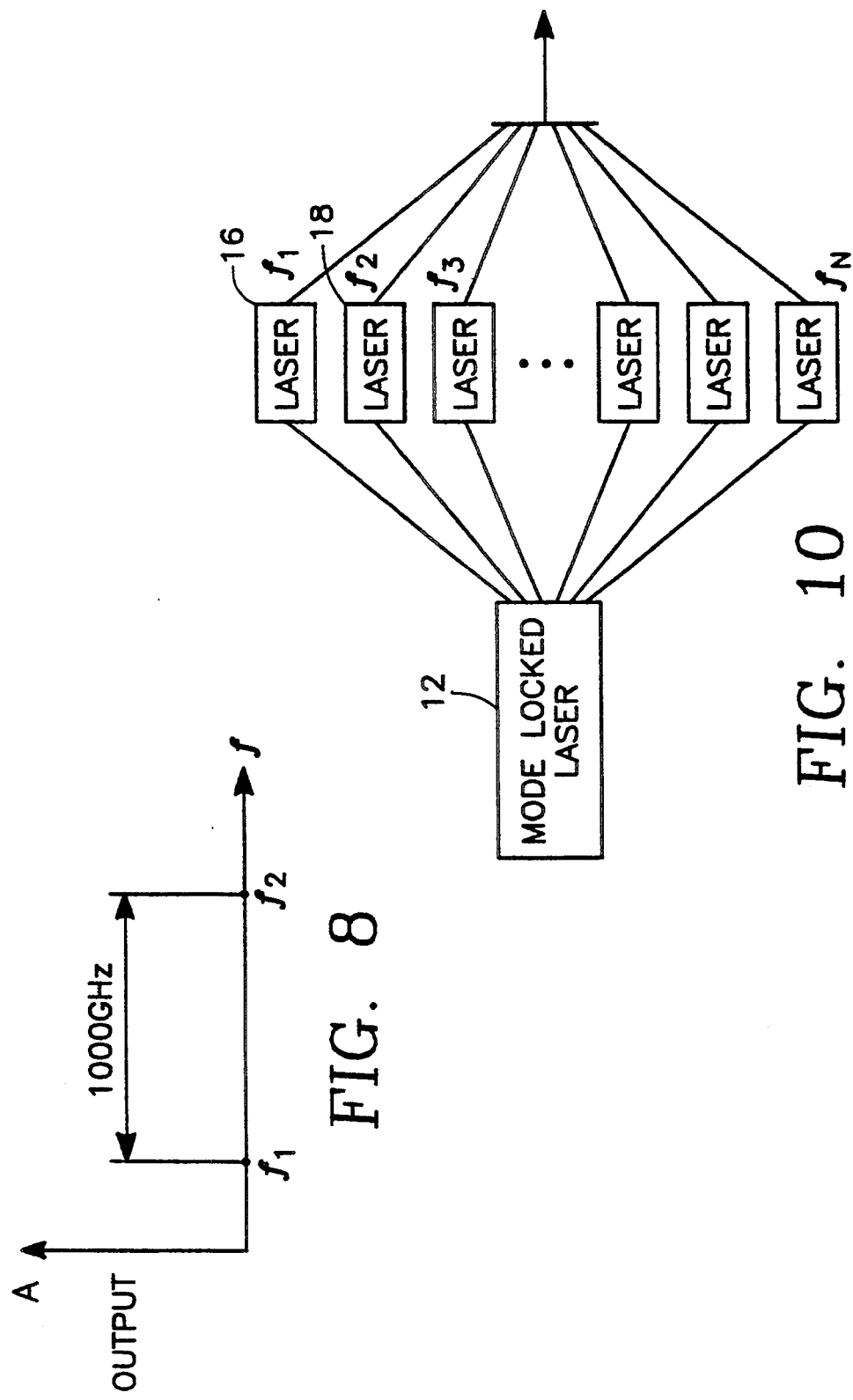
FIG. 8 is a graph illustrating the spectrum of the system of FIG. 7.

FIG. 8 illustrates a preferred embodiment of the invention in which the mode-locked laser 12 is that illustrated in FIG. 3 while each of the CW lasers 16, 18 are of the type illustrated in FIG. 6. An optical fiber 38a connects the mode-locked laser output to an optical isolator and beam splitter 14, while optical fibers 38b, 38c connect the output of the isolator and splitter 14 to each of the CW lasers 16, 18. Optical fibers 38d, 38e connect the output of the CW lasers to a beam combiner 70. Each distributed feedback electrode 62 is connected in a control loop consisting of a photodetector 72 whose input is connected to a respective one of the output optical fibers 38d, 38e and whose output is connected to an analog-to-digital converter 74. A microprocessor 76 employs a conventional feedback control algorithm to generate a distributed feedback current value from the converted detector output. A digital-to-analog converter 78 converts the distributed feedback current value to a distributed feedback current $I_{DFB}$ applied to the electrode 62.

The spectrum of the optical output from the beam combiner 70 is illustrated in FIG. 8, showing CW frequencies $f_1$ and $f_2$ of the two CW lasers 16, 18. The frequency separation between $f_1$ and $f_2$ can be as much as 1000 GHz, providing a sub-millimeter frequency source, with low phase noise, since the phase fluctuations of $f_1$ and $f_2$ will be highly correlated.

Frequency Synthesizer

Figure 7:
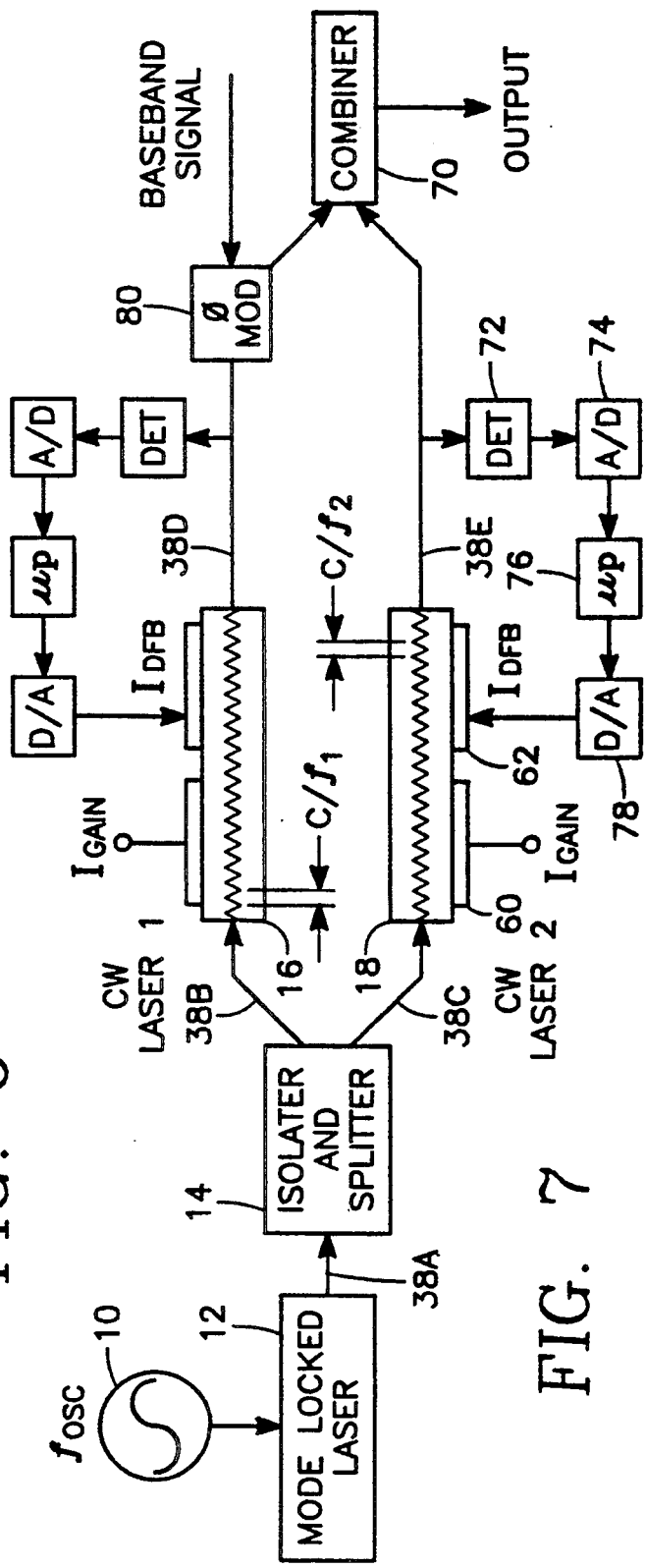
FIG. 7 is a schematic diagram illustrating a system embodying the invention.

A millimeter through submillimeter wave frequency synthesizer can be realized by the embodiment of FIG. 7 programming the microprocessor 76 to tune the laser #2 (the CW laser 18) to successive longitudinal modes of the mode-locked laser 12, while keeping laser #1 (the CW laser 16) at the same fixed frequency. In this way, frequencies from $f_{osc}$ through the top of the mode-locked laser band b (of FIG. 4) can be generated. This would correspond generally to a range of about 1 GHz to 1000 GHz. The microprocessor 76 can change the CW frequency of the injection locked laser across a wide portion of the mode-locked laser band b of FIG. 4 by relatively small percentage changes in the control current $I_{DFB}$. In accordance with one variation, the same process can be perform with laser #2 tuning it to a different succession of the longitudinal modes of the mode-locked laser 12, so that an endless variety of frequencies can be rapidly synthesized. If more than two CW lasers are injection-locked to the mode-locked laser, then they can be tuned simultaneously to different successions of the modes of the mode-locked laser 12 to produce successions of many different frequencies simultaneously.

Up-Conversion

A baseband input signal is up-converted to the millimeter or submillimeter difference frequency of the output of the combiner 70 by an electrooptical phase modulator 80 connected in series with the output optical fiber 38d. A change in phase of one of the two CW laser output beams produces a corresponding change in amplitude of the difference signal constituting the combination of the two CW laser output beams at the output of the combiner 70. Thus, the baseband signal is up-converted by applying it to the control input of the electrooptic phase modulator.

Down-Conversion

Figure 9:
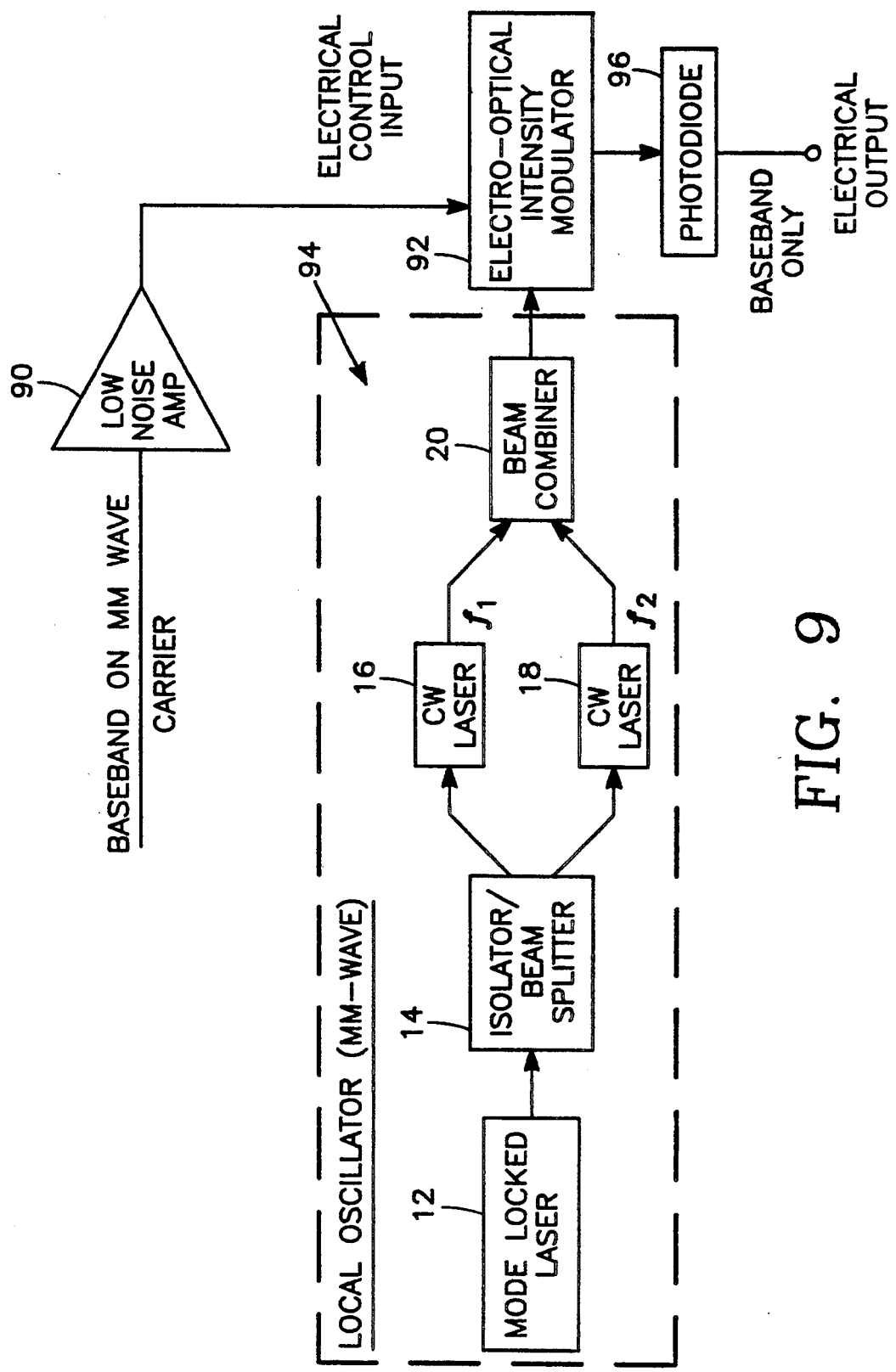
FIG. 9 is a diagram of a photonic down-converter embodying another aspect of the invention.

Millimeter and submillimeter wave downconverters are known in the art. However, FIG. 9 illustrates a photonic down-conversion system employing the millimeter wave generator of FIG. 1 as a local oscillator. An incoming RF signal constituting a baseband signal modulating a millimeter wave carrier is amplified in a low-noise amplifier 90 and applied to the electrical modulating input of an electrooptical intensity modulator 92, A local oscillator 94 constituting the millimeter wave source of FIG. 1 generates an optical millimeter wave beam having the same frequency as the millimeter wave carrier of the incoming signal 90. Conventional techniques (not shown) can be used to maintain the local oscillator 94 in phase quadrature with the carries of the incoming signal. The local oscillator signal is applied to the optical input of the electrooptic intensity modulator 92. The output beam from the electrooptic intensity modulator 92 is detected by a photodiode 96 of the conventional type having a pronounced frequency roll-off. This frequency roll-off is such that the electrical signal generated by the photodiode 96 contains the incoming baseband signal only, completing the down-conversion process.

FIG. 10 illustrates an alternative embodiment corresponding to FIG. 8 in which more than two CW lasers 16, 18, and so forth are injection-locked to respective modes of the mode-locked laser 12, thereby providing a large number of phase coherent sub-millimeter frequencies. This alternative embodiment is particularly useful in fiber optic communications where many frequencies can be employed to carry different channels.

Qualitative Analysis

A brief analysis of the conventional method of heterodyne signal generation is helpful to elucidate its shortcomings, and to understand how the new invention improves upon the state of the art. The electric field output of a laser oscillator operating in a single longitudinal mode with linear polarization has phase noise giving rise to the linewidth of the laser field emission spectrum, and is an unavoidable quantum noise process due to spontaneous emission of the atoms in the inverted population of the gain medium. For lasers operating well above threshold, it is reasonable to assume that the laser has negligible amplitude noise, so it can be treated as a constant. When the outputs of two such lasers operating at different frequencies are combined with co-linear polarizations, the resultant modulation signal has a phase variation that is proportionally much larger than the phase variations of the original laser signals. This happens because one radian of phase deviation of either one of the two lasers is exactly transformed to one radian phase in the resultant modulation signal. Since the optical frequencies are in the range of $10^{14}$ Hz, but the difference frequency is about $10^{10}$ Hz, these phase deviations are proportionately much larger at the difference frequency. Therefore, this technique typically provides poor phase noise performance, compared to electronic frequency multiplication techniques.

The present invention exploits the fact that the phase fluctuations of the individual modes in the mode-locked laser are highly correlated. This implies that the phase noise at any time is equal for any two modes of the mode-locked laser. Thus, by injection-locking the lasers #1 and #2 to different modes of the mode-locked laser, the phase noise terms of the individual lasers are forced to have the same time-independence. In practice, small errors will be incurred in the mode-locking and injection-locking processes, resulting in a small phase error between the two modes. To the extent that the laser can be perfectly mode-locked, and the phases of lasers #1 and #2 exactly locked to two different modes of the mode-locked laser, then the phase error between the two injection-locked lasers can be made arbitrarily small.

Reduction of Multiplicative Phase Noise

In electronic systems requiring microwave or millimeter)wave signals with low phase noise, the high-frequency signals are typically generated by frequency-multiplication of a low-frequency stable reference signal in a device which has a non-linear transfer function. As a result, it can be shown that the diode current contains multiples of the phase term of the input driving signal. Depending on the response speed of the diode and the particular circuit reactances, the diode will contain a "comb" of frequencies which are harmonics of the input driving frequency. The phase noise of the input voltage signal is also multiplied in this process. Therefore, the phase fluctuations of the $m^{th}$ harmonic will be m times larger than the phase fluctuations of the input signal. The phase noise multiplication is an unavoidable, and typically undesired, consequence of non-linear frequency multiplication.

By contrast, in the present invention the process that converts the reference frequency to the output frequency does not include any non-linearity. The phase stability of the reference oscillator is transferred to the modes of the mode-locked laser by a linear modulation process. Each mode essentially injection-locks its neighboring modes with the modulation sidebands induced by the reference oscillator, so that the phase fluctuations of any two of these modes become highly correlated. Therefore, when two modes separated by frequency $m \times f_{osc}$ are selected and combined, the phase fluctuations of the difference frequency will be much less than if the driving signal $f_{osc}$ was multiplied m times in non-linear diode circuit as described above.

The present invention makes possible several advantages.

1. It enables intensity modulation of optical carriers at frequencies from microwave through submillimeter wave (1 GHz to 1000 GHz), and 2. It provides for phase-coherent generation of millimeter-wave signals from a lower-frequency reference signal, without multiplication of reference signal phase noise inherent in previous non-linear frequency multiplication techniques.

It is anticipated that this invention will have broad applicability in systems employing microwave, millimeter wave or submillimeter wave signals. It will enable optical fiber waveguides and photonic signal processing components to be used at these frequencies. Optical fiber waveguides have thousands of GHz of available bandwidth, very low loss, and high stability, far exceeding the performance of the best metallic waveguides. Optical intensity detectors have been demonstrated with frequency responses in excess of 250 GHz. Optical amplifiers have been demonstrated to have bandwidths in excess of 1000 GHz. Optical integrated tapped delay line filters can be used to construct tunable pass bands in the millimeter wave ranges. To date, however, the bandwidth of optical fiber transmission systems for analog signals has been limited to merely tens of GHz by the speed of available optical intensity modulators. The proposed invention will eliminate this performance bottleneck and allow the full bandwidth potential of optical fiber and photonic components to be employed for analog signal transmission and processing.

While the invention has been described in detail by specific reference to preferred embodiments, variations and modifications thereof may be made without departing from the true spirit and scope of the invention.

What is claimed is:

1. A signal generator, comprising:
   an actively mode-locking modulation signal source having a frequency harmonically related to a desired output frequency;
   a laser coupled to said actively mode-locking modulation signal source and having plural optical modes actively mode-locked by said actively mode-locking modulation signal source and characterized by respective mode frequencies, whereby said laser is an actively mode-locked laser;

plural tuned lasers, each of said plural tuned lasers being tuned to a respective optical frequency, corresponding to respective ones of said mode frequencies, wherein a difference in the optical frequencies of different ones of said plural tuned lasers corresponds to a desired output frequency;

means for injection-locking said plural tuned lasers to corresponding ones of said plural optical modes of said mode-locked laser; and means for combining the optical outputs of said plural tuned lasers whereby to generate at least an output signal having an output frequency equal to said difference in the optical frequencies of different ones of said plural tuned lasers and corresponding to said desired output frequency.

2. The signal generator of claim 1 wherein said plural optical modes of said mode-locked laser span a frequency band at least hundreds of GigaHertz wide, and wherein said output frequency is in a band encompassing millimeter and submillimeter wavelengths.

3. The signal generator of claim 2 wherein said plural tuned lasers comprise a pair of C.W. lasers each narrowly tuned to a respective optical frequency corresponding to a frequency difference therebetween equal to said output frequency.

4. The signal generator of claim 1 wherein said means for injection-locking comprises means for coupling optical radiation from an optical cavity of said mode-locked laser to an optical cavity of each one of said plural tuned lasers.

5. The signal generator of claim 1 further comprising up-converter means for modulating said output signal with a baseband signal.

6. The signal generator of claim 5 wherein said up-converter means comprises means for modulating the optical output of one of said plural tuned lasers with said baseband signal prior its being combined by said means for combining.

7. The signal generator of claim 6 wherein said means for modulating comprises an electrooptical phase modulator having an optical input connected to said one tuned laser and an optical output connected to said means for combining and an electrical control input connected to received said baseband signal.

8. The signal generator of claim 5 wherein each of said plural tuned lasers comprises means for narrowly tuning the laser to the respective optical frequency.

9. The signal generator of claim 8 wherein each of said plural tuned lasers is a semiconductor laser having an optically active semiconductor layer underlying an upper semiconductor layer, and wherein said means for narrowly tuning comprises an optical grating overlying said optically active layer, said grating having a grating spacing corresponding to said respective optical frequency.

10. The signal generator of claim 9 wherein said mode-locked laser comprises a semiconductor laser having an optically active layer, and wherein said means for injection-locking comprises plural optical fibers connected between an edge of said optically active layer of said mode-locked laser to an edge of the optically active layer of respective ones of said plural tune lasers.

11. The signal generator of claim 9 wherein said means for narrowly tuning of each one of said plural tuned lasers further comprises:

a distributed feedback electrode overlying the optically active layer of said tuned laser;

a photodiode sensing the optical output of the tuned laser;

microprocessor means coupled to an electrical output of said photodiode for generating a distributed feedback voltage value so as to maximize an optical amplitude sensed by said photodiode; and means for applying a voltage corresponding to said distributed feedback voltage value to said distributed feedback electrode whereby to maintain an effective cavity length of said tuned laser at an optimum value for said optical frequency of said tuned laser.

12. The signal generator of claim 11 wherein said microprocessor means is programmed to tune the tuned laser thereof to a succession of said optical modes of said mode-locked laser.

13. The signal generator of claim 8 wherein said means for tuning comprises means for tuning at least one of said plural tuned lasers to a succession of said optical modes of said mode-locked laser.

14. The signal generator of claim 1 further comprising means for tuning plural ones of said plural tuned lasers to respective successions of said optical modes of said mode-locked laser.

15. An optical down-converter for down-converting an incoming signal constituting a carrier signal of a particular carrier frequency and a baseband signal, comprising:

I. a local oscillator comprising:

A. a mode-locked laser having plural optical modes characterized by respective mode frequencies, B. plural tuned lasers, each of said plural tuned lasers being tuned to a respective optical frequency, corresponding to respective ones of said mode frequencies, wherein a difference in the optical frequencies of different ones of said plural tuned lasers corresponds to a desired output frequency, C. means for injection-locking said plural tuned lasers to corresponding ones of said plural optical modes of said mode-locked laser, D. means for combining the optical outputs of said plural tuned lasers whereby to generate a local oscillator optical signal having a local oscillator frequency equal to said difference in the optical frequencies of different ones of said plural tuned lasers;

II. means for modulating said local oscillator optical signal with said incoming signal so as to produce a mixed signal; and III. means for detecting said baseband signal.

16. The optical down-converter of claim 15 wherein said means for modulating said local oscillator optical signal comprise an electrooptical modulator having an optical input connected to receive said local oscillator optical signal, an optical output and an electrical control input connected to receive said incoming signal.

17. The optical down-converter of claim 16 wherein said means for detecting said baseband signal comprises a photodiode optically coupled to said optical output of said electrooptical modulator.

18. The optical down-converter of claim 17 wherein said photodiode of said means for detecting said baseband signal is characterized by a frequency response roll-off suitable for rejecting frequencies corresponding to said local oscillator frequency.

19. The optical down-converter of claim 15 wherein said plural optical modes of said mode-locked laser span a frequency band at least hundreds of GigaHertz wide, and wherein said output frequency is in a band encompassing millimeter and submillimeter wavelengths.

20. The optical down-converter of claim 19 wherein said plural tuned lasers comprise a pair of C.W. lasers each narrowly tuned to a respective optical frequency corresponding to a frequency difference therebetween equal to said output frequency.

* * * * *